US009722607B2

(12) United States Patent
Lee

(10) Patent No.: US 9,722,607 B2
(45) Date of Patent: Aug. 1, 2017

(54) VOLTAGE LEVEL SHIFTER

(71) Applicant: SK hynix Inc., Gyeonggi-do (KR)

(72) Inventor: Seung-Ho Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/973,410

(22) Filed: Dec. 17, 2015

(65) Prior Publication Data

US 2017/0012625 A1     Jan. 12, 2017

(30) Foreign Application Priority Data

Jul. 10, 2015  (KR) .................. 10-2015-0098303

(51) Int. Cl.
*H03L 5/00* (2006.01)
*H03K 19/0175* (2006.01)
*H03K 3/356* (2006.01)

(52) U.S. Cl.
CPC .......... *H03K 19/017509* (2013.01); *H03K 3/356182* (2013.01)

(58) Field of Classification Search
None
See application file for complete search history.

(56) References Cited

U.S. PATENT DOCUMENTS

| 7,053,657 | B1 | 5/2006 | Peng |
| 7,501,856 | B2 | 3/2009 | Huang |
| 8,957,708 | B2* | 2/2015 | Miyazaki .............. G05F 1/10 327/108 |
| 9,417,647 | B2* | 8/2016 | Kim ..................... G05F 3/02 |
| 9,425,793 | B2* | 8/2016 | Park ................ H03K 19/00361 |

(Continued)

FOREIGN PATENT DOCUMENTS

| KR | 1020080067039 | 7/2008 |
| KR | 101193061 | 10/2012 |

OTHER PUBLICATIONS

Chang, I., et al., Robust Level Converter for Sub-Threshold/Super-Threshold Operation:100 mV to 2.5 V, IEEE Transactions on Very Large Scale Integration (VLSI) Systems, Aug. 2011, pp. 1429-1437, vol. 19, No. 8.

(Continued)

*Primary Examiner* — Lincoln Donovan
*Assistant Examiner* — Khareem E Almo
(74) *Attorney, Agent, or Firm* — IP & T Group LLP

(57) ABSTRACT

A voltage level shifter includes: in stages a pull-down driving unit suitable for receiving an input signal swinging between a ground voltage and a first supply voltage, and pull-down driving an output node to the ground voltage according to a voltage level of the input signal, wherein an output signal outputted through the output node swings between the ground voltage level and a second supply voltage level higher than the first supply voltage; a pull-up driving unit suitable for pull-up driving the output node, to the second supply voltage according to the voltage level of the input signal; a bias generation unit suitable for generating a bias voltage fixed to a preset voltage level; and a bias operation unit coupled between the output node and the pull-down driving unit, and suitable for lowering a voltage level of the output node in stages based on the bias voltage to supply the lowered voltage to the pull-down driving unit when a pull-down operation is performed by the pull-down driving unit.

14 Claims, 3 Drawing Sheets

(56) References Cited

U.S. PATENT DOCUMENTS

| 9,432,006 B2* | 8/2016 | Hwang | H03L 5/00 |
| 2007/0046357 A1* | 3/2007 | Shimizu | H03K 3/356113 |
| | | | 327/333 |
| 2014/0293716 A1* | 10/2014 | Kato | G11O 5/147 |
| | | | 365/189.11 |

OTHER PUBLICATIONS

Ashouei, M., et al., Novel wide voltage range level shifter for near-threshold designs, 2010 17th IEEE International Conference on Electronics, Circuits, and Systems (ICECS), Dec. 2010, pp. 285-288.

* cited by examiner

VOLTAGE LEVEL SHIFTER

CROSS-REFERENCE TO RELATED APPLICATIONS

The application claims priority of Korean Patent Application No. 10-2015-0098303, filed on Jul. 10, 2015, which is incorporated herein by reference in its entirety.

BACKGROUND

1. Field

Various embodiments of the invention relate generally to semiconductor design technology, and more particularly to a voltage level shifter.

2. Description of the Related Art

Use of IoT (i.e., Internet of Things) and wearable electronic devices is expected to increase at a fast pace. One requirement for such devices is low power consumption. Various technologies, have been proposed for providing low power consumption including a technology generally referred to as NTV (Near Threshold Voltage) technology.

NTV technology may generally lower the power consumption of an electronic device by lowering the voltage level of one or more input signals to the device to more closely match the device's performance requirements. For example, NTV technology may lower the voltage level of an input signal to a value close to the threshold voltage level of a transistor, thereby minimizing power consumption. As illustrated in FIG. 1, the voltage level range of an input signal defined in the NTV technology may be defined as a voltage level range FRUGAL between a minimum level of a standard voltage VCORE and threshold voltage level of the transistor.

However, while NTV may lower power consumption, it may also cause operational malfunctioning of the electronic device because existing voltage level shifters used in integrated circuit devices are not capable of handling such voltage changes. For example, as the voltage of a signal inputted to a voltage level shifter is lowered, the performance of one or more transistors of the voltage level shifter may be degraded, thus also affecting the operation of the electronic device, voltage level shifter voltage level shifter voltage level shifter

SUMMARY

Various embodiments of the invention are directed to a voltage level shifter capable of stably shifting an input signal having a broad range of voltage levels from a low voltage level to a high voltage level, to an electronic device incorporating the voltage level shifter and a method of operation thereof. The voltage power shifter may be used with any suitable electronic device, however, it is particularly suited for integrated circuit electronic devices and especially IoT and wearable electronic devices requiring low power consumption. The voltage power shifter is particularly suitable for use in IC electronic devices incorporating power consumption lowering technologies such as NTV technology.

According to an embodiment of the invention, there is provided a voltage level shifter, the voltage level shifter including: a pull-down driving unit suitable for receiving an input signal swinging between a ground voltage and a first supply voltage, and pull-down driving an output node to the ground voltage according to a voltage level of the input signal, wherein an output signal outputted through the output node swings between the ground voltage level and a second supply voltage level higher than the first supply voltage; a pull-up driving unit suitable for pull-up driving the output node, to the second supply voltage according to the voltage level of the input signal; a bias generation unit suitable for generating a bias voltage fixed to a preset voltage level; and a bias operation unit coupled between the output node and the pull-down driving unit, and suitable for lowering a voltage level of the output node in stages based on the bias voltage to supply the lowered voltage to the pull-down driving unit when a pull-down operation is performed by the pull-down driving unit.

According to another embodiment, a voltage level shifter is provided, the voltage level shifter including: a pull-down driving unit suitable for receiving an input signal swinging between a ground voltage and a first supply voltage, and pull-down driving an output node and a complementary output node to the ground voltage according to a voltage level of the input signal, wherein an output signal outputted through the output node swings between the ground voltage level and a second supply voltage level higher than the first supply voltage; a pull-up driving unit suitable for pull-up driving the output node pair, to the second supply voltage based on the voltage level of the input signal; a bias generation unit suitable for generating a bias voltage fixed to a preset voltage level; and a bias operation unit coupled between the pull-down driving unit and the output node pair, and suitable for lowering voltage levels of the output node pair in stages based on the bias voltage to supply the lowered voltages to the pull-down driving unit when a pull-down operation is performed by the pull-down driving unit.

DETAILED DESCRIPTION

Figure 1:
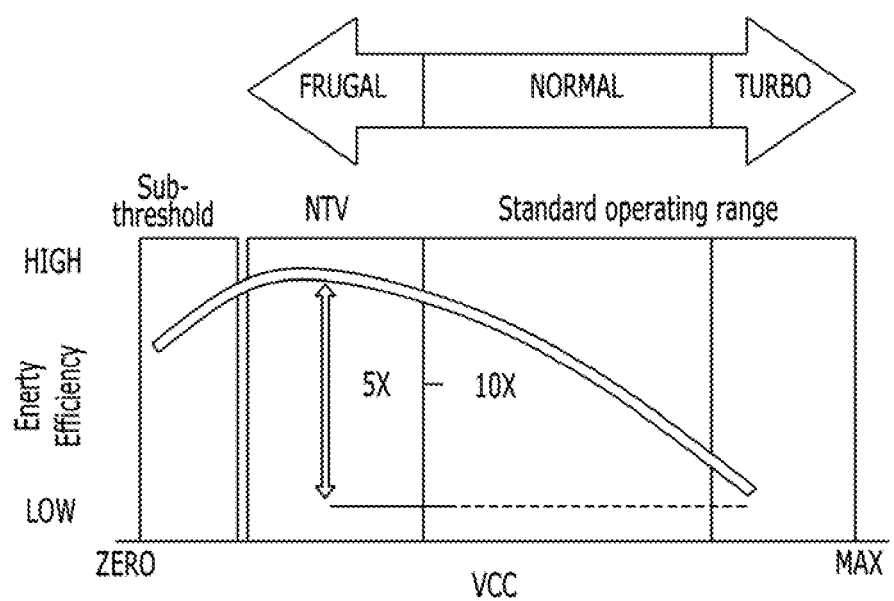
FIG. 1 is a diagram describing NTV technology.

Various embodiments of the invention will be described below in more detail with reference to the accompanying drawings. It should be understood, however, that the invention may be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component.

Figure 2:
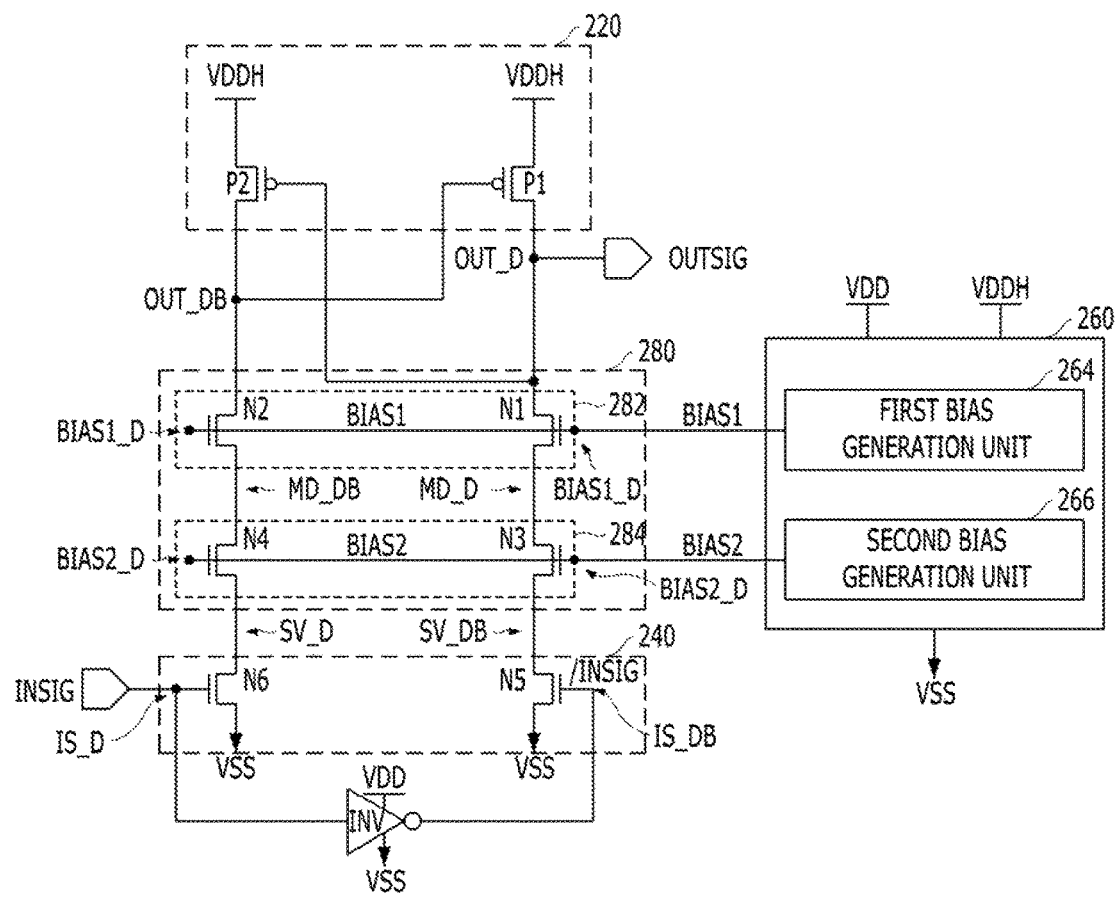
FIG. 2 is a diagram illustrating a voltage level shifter according to an embodiment of the invention.

FIG. 2 is a diagram illustrating a voltage level shifter according to an embodiment of the invention.

Referring to FIG. 2, the voltage level shifter may receive input signals INSIG and /INSIG which swing between a ground voltage VSS and a first supply voltage VDD and generate an output signal OUTSIG which swings between the ground voltage VSS and a second supply voltage VDDH higher than a first supply voltage VDD.

The voltage level shifter may include a pull-up driving unit 220, a pull-down driving unit 240, a bias generation unit 260, and a bias operation unit 280. The bias operation unit 280 may include a first bias operation unit 282 and a second bias operation unit 284. The bias generation unit 260 may include a first bias generation unit 264 and a second bias generation unit 266.

The pull-down driving unit 240 may pull-down drive output nodes (i.e., an output node pair) OUT_D and OUT_DB to the ground voltage VSS in response to the input signals INSIG and /INSIG. The output signal OUTSIG may be provided through the output node OUT_D.

The pull-up driving unit 220 may pull-up drive the output nodes OUT_D and OUT_DB to the second supply voltage VDDH according to the input signals INSIG and /INSIG.

The bias generation unit 260 may generate bias voltages BIAS1 and BIAS2 fixed to a voltage level higher than the first supply voltage VDD and lower than the second supply voltage VDDH.

The first bias generation unit 264 may generate the first bias voltage BIAS1 fixed to a first level. The first level may be set within a voltage range higher than the first supply voltage VDD and lower than the second supply voltage VDDH.

The second bias generation unit 266 may generate the second bias voltage BIAS2 fixed to a second level higher than the first supply voltage VDD and lower than the first level. For example, a level of the second bias voltage BIAS2 may be fixed whenever the second bias voltage BIAS2 is lower than the first bias voltage BIAS1.

The bias operation unit 280 may be coupled between the pull-down driving unit 240 and the output nodes OUT_D and OUT_DB. During a pull-down operation, the bias operation unit 280 may lower the level of the output nodes OUT_D and OUT_DB gradually or in stages in response to the bias voltages BIAS1 and BIAS2 and supply the lowered voltage level to the pull-down driving unit 240.

The first bias operation unit 282 may lower the voltage level of the output nodes OUT_D and OUT_DB by the first level in response to the first bias voltage BIAS1, and supply the lowered voltage level to intermediate nodes MD_D and MD_DB, during a pull-down operation.

The second bias operation unit 284 may lower the voltage level of the intermediate nodes MD_D and MD_DB by the second level in response to the second bias voltage BIAS2, and supply the lowered voltage to nodes SV_D and SV_DB of the pull-down driving unit 240, during a pull-down operation.

The first and second bias operation units 282 and 284 may be coupled in a cascade manner between the pull-down driving unit 240 and the output nodes OUT_D and OUT_DB.

The input signals INSIG and /INSIG may be inputted in a differential manner. For example, the voltage level shifter may be operated in a differential manner while two current paths are coupled to each other in a current mirror type. Thus, the voltage level shifter may further include an inverter INV which outputs the complementary input signal /INSIG and operates between the first supply voltage VDD and the ground voltage VSS. The complementary input signal /INSIG may be generated by inverting the input signal INSIG. The input signals INSIG and /INSIG generated in a differential manner through the inverter INV may be inputted to input nodes IS_D and IS_DB, through which the input signals INSIG and /INSIG may be inputted to the pull-down driving unit 240, for determining whether to perform a pull-down operation. Furthermore, the bias operation unit 280 may be formed between the pull-down driving unit 240 and the pull-up driving unit 220, and coupled in a cascade manner. Thus, although the input signals INSIG and /INSIG may not directly be applied to the pull-up driving unit 220, the pull-up driving unit 220 may determine whether to perform a pull-up operation according to the voltage levels of the input signals INSIG and /INSIG.

Furthermore, when the output nodes OUT_D and OUT_DB, pull-up driven to the second supply voltage VDDH by the pull-up driving unit 220, are pull-down driven to the first supply voltage VDD by the pull-down driving unit 240, the bias operation unit 280 may not directly supply the output signal OUTSIG driven to the second supply voltage VDDH to the pull-down driving unit 240, but may lower the nodes OUT_B and OUT_DB of the output signals OUTSIG in stages and supply the lowered voltage level to the pull-down driving unit 240. This may be because a difference between the second supply voltage VDDH and the first supply voltage VDD is relatively large. For example, the second supply voltage VDDH may range from 3.3V to 1.8V, and the first supply voltage VDD may range from 1.1V to 0.6V. Thus, a maximum difference of 2.7V may occur. Therefore, since the operation in which the output nodes OUT_D and OUT_DB, pull-up driven to the second supply voltage VDDH, may be directly pull-down driven to the first supply voltage VDD by the pull-down driving unit 240 may not be normally performed, the bias operation unit 280 may be included between the pull-up driving unit 220 and the pull-down driving unit 240.

For implementing the role of the bias operation unit 280, first and second bias voltages BIAS1 and BIAS2 may be required. The first bias voltage BIAS1 may be fixed to the first level set in a range that is higher than the first supply voltage VDD and lower than the second supply voltage VDDH, and the second bias voltage BIAS2 may be fixed to the second level. The reason for this will be described below in more detail.

The pull-up driving unit 220 may include first and second PMOS transistors P1 and P2 coupled in a current mirror type. The first PMOS transistor P1 may have a gate coupled to the complementary output node OUT_DB, a source coupled to the second supply voltage VDDH terminal, and a drain coupled to the output node OUT_D. The second PMOS transistor P2 may have a gate coupled to the output node OUT_D, a source coupled to the second voltage VDDH terminal, and a drain coupled to the complementary output node OUT_DB.

The first bias operation unit 282 may include first and second NMOS transistors N1 and N2. The first NMOS transistor N1 may have a gate coupled to a node BIAS1_D where the first bias voltage BIAS1 is applied, a drain coupled to the output node OUT_D, and a source coupled to the intermediate node MD_D. The second NMOS transistor N2 may have a gate coupled to the node BIAS1_D, a drain coupled to the complementary output node OUT_DB, and a source coupled to the complementary intermediate node MD_DB.

The second bias operation unit 284 may include third and fourth NMOS transistors N3 and N4. The third NMOS transistor N3 may have a gate coupled to a node BIAS2_D where the second bias voltage BIAS2 is applied, a drain coupled to the intermediate node MD_D, and a source coupled to the node SV_DB. The fourth NMOS transistor N4 may have a gate coupled to the node BIAS2_D, a drain coupled to the complementary intermediate node MD_DB, and a source coupled to the node SV_D.

The pull-down driving unit 240 may include fifth and sixth NMOS transistors N5 and N6. The fifth NMOS transistor N5 may have a gate coupled to the input node IS_DB of the input signals INSIG and /INSIG, a drain coupled to the node SV_DB, and a source coupled to the ground voltage VSS terminal. The sixth NMOS transistor N6 may have a gate coupled to the input node IS_D, a drain coupled to the node SV_D, and a source coupled to the ground voltage VSS terminal.

The gates of the first and second NMOS transistors N1 and N2 included in the first bias operation unit 282 may have a relatively large gate oxide thickness. On the other hand, the gates of the third and fourth NMOS transistors N3 and N4 included in the second bias operation unit 284 and the gates of the fifth and sixth NMOS transistors N5 and N6 included in the pull-down driving unit 240 may have a relatively smaller gate oxide thickness.

As the gates of the first and second NMOS transistors N1 and N2 have a relatively large thickness and the gates of the third to sixth NMOS transistors N3 to N6 have a relatively small thickness, the following differences may be observed.

First, the thinner NMOS transistors N<3:6> and the thicker NMOS transistors N<1:2> may have different threshold voltage levels. For example, while the thinner NMOS transistors N<3:6> have a threshold voltage level of 0.2V to 0.3V, the thicker NMOS transistors N<1:2> may have a threshold voltage level of 0.4V to 0.5V. That is, as the gate thickness increases the value of the threshold voltage level also increases.

Second, the thinner NMOS transistors N<3:6> and the thicker NMOS transistors N<1:2> may have different limit values for voltage differences among a gate-drain voltage Vgd, a gate-source voltage Vgs, and a drain-source voltage Vds which are set to guarantee reliability. For example, the thinner NMOS transistors N<3:6> may have a smaller limit value than the thicker NMOS transistors N<1:2> for voltage differences among the gate-drain voltage Vgd, the gate-source voltage Vgs, and the drain-source voltage Vds, which are set to guarantee reliability.

Hence, the characteristics each NMOS transistor may be changed by changing the gate thickness of the transistor.

The first and second NMOS transistors N<1:2> having a relatively large gate thickness may be included in the first bias operation unit 282, and the third to sixth NMOS transistors N<0:6> having a relatively small thickness may be included in the second bias operation unit 284 and the pull-down driving unit 240.

The fifth and sixth NMOS transistors N<5:6> included in the pull-down driving unit 240 may have a relatively small gate thickness for reasons which will become apparent from the following description.

The input signals INSIG and /INSIG may swing between the first supply voltage VDD and the ground voltage VSS. The first supply voltage VDD may need to satisfy the voltage level region defined in the NTV technology, that is, the voltage level region FRUGAL between the minimum level of the standard voltage VCORE and the threshold voltage level of the transistor in FIG. 1. For example, the first supply voltage VDD may have a voltage level region of 0.6V to 1.1V, and the voltage level region may be considered as a very low voltage level region.

In order for the pull-down driving unit 240 to normally operate when the input signals INSIG and /INSIG have a very low voltage level region, the threshold voltage level of the fifth and sixth NMOS transistors N<5:6> included in the pull-down driving unit 240 may need to be maintained at a relatively low level. For example, the pull-down driving unit 240 may include the first and sixth NMOS transistors N<5:6> having a threshold voltage level of 0.2 to 0.3V, to stably operate even when the input signals INSIG and /INSIG may have the lowest voltage level of 0.6V.

The reason why the first and second NMOS transistors N<1:2> having a relatively large gate thickness are included in the first bias operation unit 282 and the third to sixth NMOS transistors N<3:4> having a relatively small thickness are included in the second bias operation unit 284 will become apparent from the following description.

The first bias operation unit 282 and the second bias operation unit 284 may be pull-up driven by the pull-up driving unit 220, lower the second supply voltage VDDH applied to the output nodes OUT_D and OUT_DB in stages, and supply the lowered second supply voltage VDDH to the pull-down driving unit 240.

The first and second NMOS transistors N<1:2> included in the first bias operation unit 282 may directly receive the relatively high second supply voltage VDDH through the output nodes OUT_D and OUT_DB that are directly coupled to the drains thereof. Thus, the first and second NMOS transistors N<1:2> may have a relatively large gate thickness, to secure the reliability of the transistors while lowering the second supply voltage VDDH.

On the other hand, since the sources of the first and second NMOS transistors N<1:2> included in the first bias operation unit 282 and the drains of the third and fourth NMOS transistors N<3:4> included in the second bias operation unit 284 are coupled in a cascade manner around the intermediate nodes MD_D and MD_DB, a lower level than the second supply voltage VDDH may be applied to the intermediate nodes MD_D and MD_DB. Thus, the third and fourth NMOS transistors N<3:4> may have a relatively small gate thickness, for lowering the voltage level of the intermediate nodes MD_D and MD_DB while maintaining the minimum resistance value.

Although the first and second NMOS transistors N<1:2> included in the first bias operation unit 282 have a relatively large gate thickness and the third to fourth NMOS transistors N<3:4> included in the second bias operation unit 284 have a relatively small gate thickness, another condition may need to be satisfied, for lowering the second supply voltage VDDH applied to the output node OUT_D in stages. That is, when the first bias voltage BIAS1 applied to the first bias operation unit 282 is fixed to the first level and the second bias voltage BIAS2 applied to the second bias operation unit 284 is fixed to the second level, the second supply voltage VDDH applied to the output node OUT_D may be lowered in stages through the first and second bias operation units 282 and 284, and then supplied to the pull-down driving unit 240.

The first and second levels may be set according to the following four conditions.

The first condition is where the first bias voltage BIAS1 fixed to the first level is applied to the gates of the first and second NMOS transistors N<1:2> included in the first bias operation unit.

The second condition is where the second bias voltage BIAS2 fixed to the second level is applied to the gates of the third and fourth NMOS transistors N<3:4> Included in the second bias operation unit.

The third condition is where the first and second NMOS transistors N<1:2> are coupled in a cascade manner.

The fourth condition is where the first and second NMOS transistors N<1:2> have a relatively large gate thickness and the third and fourth NMOS transistors N<3:4> have a relatively less gate oxide thickness.

Due to the configuration based on the first condition of the above four conditions, the first level may need to be lower than the second supply voltage VDDH. This may be because a difference in gate-drain voltage Vgd between the first and second NMOS transistors N<1:2> may need to be set to a voltage level that may guarantee reliability. That is, the drains and sources of the first and second NMOS transistors N<1:2> may have a certain difference in response to the first bias voltage BIAS1, and the difference may be set to such a voltage level that may guarantee reliability.

Due to the configuration based on the third and fourth conditions, the first level may need to be fixed to a proper value in a range between the second supply voltage VDDH and the second level. Furthermore, due to the configuration based on the second condition, the second level may need to be lower than the first level. This may be because a difference in drain-source voltage Vds between the first and second NMOS transistors N<1:2> and a difference in gate-drain voltage Vgd between the third and fourth NMOS transistors N<3:4> need to be set to a voltage level that may guarantee the reliability of the transistor operation. That is, the drains and sources of the second and fourth NMOS transistors N<3:4> may have a certain difference in response to the second bias voltage BIAS2, and the difference may be set to a voltage level that may guarantee reliability.

Furthermore, when the above four conditions are satisfied, the first and second levels may be determined to minimize the resistance values of the first to fourth NMOS transistors N<1:4> which operate in response to the first and second bias voltages BIAS<1:2>.

For example, when the second supply voltage VDDH ranges from 1.8V to 3.3V, the first supply voltage VDD ranges from 0.6V to 1.1V, the threshold voltage level of the first and second NMOS transistors N<1:2> is 0.5V, and the threshold voltage level of the third and fourth NMOS transistor N<3:4> is 0.3V, the first level may be fixed to 1.98V, and the second level may be fixed to 1.21V.

Although a voltage of 1.8V to 3.3V is applied to the drains of the first and second NMOS transistors N<1:2>, that is, the output nodes OUT_D and OUT_DB, the drain-gate voltage Vdg of the first and second NMOS transistors N<1:2> may range from −0.18V to 1.32V, the drain-source voltage Vds may range from 0.32V to 1.82V, the gate-source voltage Vgs may be set to 0.5V, and the intermediate nodes MD_D and MD_DB may have a voltage of 1.48V at all times, because the first bias voltage BIAS1 is 1.98V. Thus, while a voltage difference, which is enough to guarantee the reliability of the first and second NMOS transistors N<1:2> is provided, the voltage level applied to the intermediate nodes MD_D and MD_DB may have a stable state, regardless of whether the second supply voltage VDDH applied to the output nodes OUT_D and OUT_DB is significantly changed.

Furthermore, although a voltage of 1.48V is applied to the drains of the third and fourth NMOS transistors N<3:4>, that is, the Intermediate nodes MD_D and MD_DB, the drain-gate voltage Vdg of the third and fourth NMOS transistors N<3:4> may be set to 0.27V, the drain-source voltage Vds may be set to 0.57V, the gate-source voltage Vgs may be set to 0.3V, and the nodes SV_D and SV_DB may have a voltage of 0.91V at all times, because the second bias voltage BIAS2 is 1.21V. Thus, a voltage difference, which is enough to guarantee the reliability of the third and fourth NMOS transistors N<3:4> may be provided.

Furthermore, since a voltage of 0.91V is applied to the drains of the fifth and sixth NMOS transistors N<5:6> included in the pull-down driving unit 240, that is, the nodes SV_D and SV_DB, the drain-gate voltage Vdg of the fifth and sixth NMOS transistors N<5:6> may range from 0.31V to −0.19V, the drain-source voltage Vds may range from 0.61V to 0.11V, and the gate-source voltage Vgs may be set to 0.3V, even though the input signals INSIG and /INSIG applied to the gates have a voltage of 0.6V to 1.1V. Thus, the fifth and sixth NMOS transistors N<5:6> may be normally pull-down driven.

Figure 3:
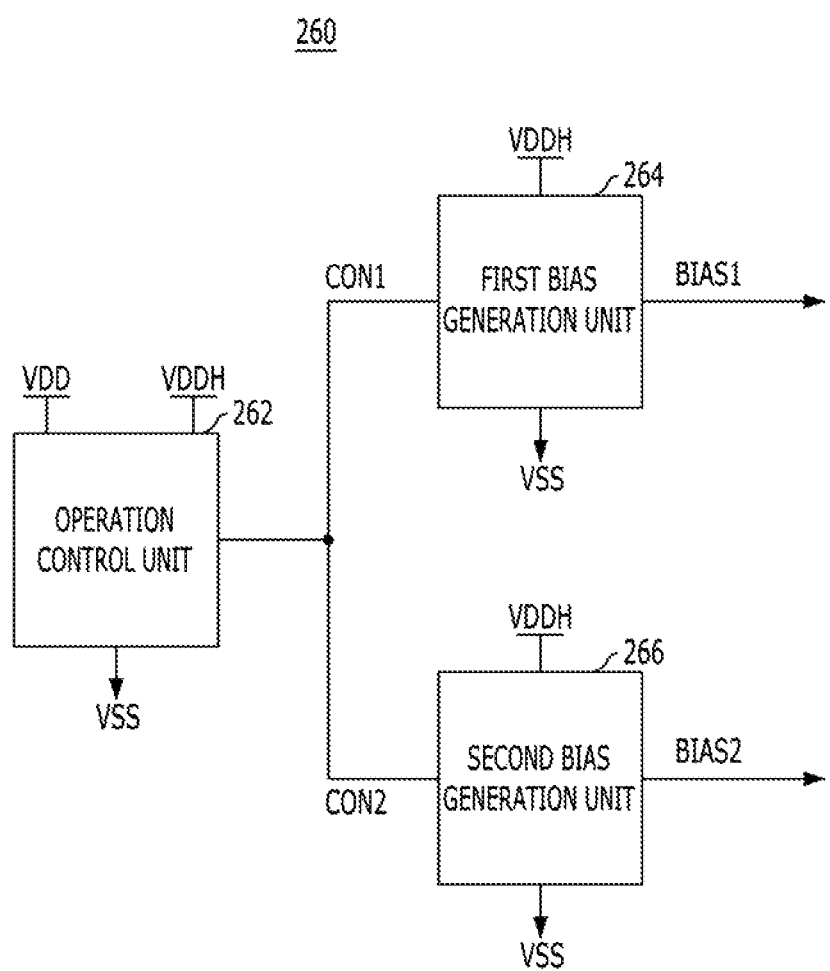
FIG. 3 is a diagram of a bias generation unit voltage level shifter, according to an embodiment of the invention

FIG. 3 is a detailed circuit diagram of the bias generation unit 260 of the level shifter illustrated in FIG. 2.

Referring to FIG. 3, the bias generation unit 260 may further include an operation control unit 262 in addition to the first and second bias generation units 264 and 266.

The operation control unit 262 may detect whether the first supply voltage VDD and the second supply voltage VDDH are turned on/off based on the preset initial level, and may control the operations of the first and second bias generation units 264 and 266 according to the detection result.

According to some embodiments, the operation control unit 262 may be required because a method for selectively turning on/off the first supply voltage VDD and the second supply voltage VDDH may be used. Also, the control method may be changed according to the type of a device to which the voltage level shifter is applied. For example, a part of the voltages may be turned off at the exact point of time when the modified power is initially supplied to the corresponding device.

In this way, when a specific voltage is turned off, the turning-off of the voltage may be detected to properly control the operation of the voltage level shifter. Hence, a malfunction of the voltage level shifter may be prevented while at the same preventing excess power consumption.

The operation control unit 262 may be used to control the operation of the voltage level shifter. An example operation control method for the operation control unit 262 is described in the following Table 1.

TABLE 1

| VDD | VDDH | First bias generation unit | Second bias generation unit |
|---|---|---|---|
| OFF | OFF | no action required | no action required |
| OFF | ON | generate VSS | no action required |
| ON | OFF | no action required | normal operation |
| ON | ON | normal operation | normal operation |

Referring to Table 1, when the first and second supply voltage levels VDD and VDDH become lower than the initial level and are detected as OFF, the operation control unit 262 may not perform a compulsory control operation on the first and second bias generation units 264 and 266 (i.e., no action required).

When the first supply voltage VDD becomes lower than the initial level and is detected as OFF and the second supply voltage VDDH becomes higher than the initial level and is detected as ON, the operation control unit 262 may control the first bias generation unit 264 to fix the first bias voltage BIAS1 to the ground voltage VSS, but may not perform a compulsory control operation on the second bias generation unit 266 (i.e., no action required).

When the first supply voltage VDD becomes higher than the initial level and is detected as ON and the second supply voltage VDDH becomes lower than the initial level and is detected as OFF, the operation control unit 262 may not perform a compulsory control operation on the first bias generation unit 264, but may control the second bias generation unit 266 to fix the second bias voltage BIAS2 to the second level (i.e., normal operation).

When the first and second supply voltage levels VDD and VDDH become higher than the initial level and are detected as ON, the operation control unit 262 may control the first and second bias generation units 264 and 266 to fix the first and second bias voltages BIAS1 and BIAS2 to the first and second levels, respectively (i.e., normal operation).

According to an embodiment of the invention, when shifting an input signal having a low voltage level to a high voltage level, the voltage level shifter may lower the driving voltage having a high voltage level in stages, and may supply the lowered driving voltage to a transistor to which the input signal having a low voltage level is applied. Through this operation, the transistor may be stably operated even when receiving an input signal having a low voltage level, and thus the voltage level shifter may be stably operated.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of Input signals.

What is claimed is:

1. A voltage level shifter comprising:
   a pull-down driving unit suitable for receiving an input signal swinging between a ground voltage and a first supply voltage, and pull-down driving an output node to the ground voltage according to a voltage level of the input signal, wherein an output signal outputted through the output node swings between the ground voltage level and a second supply voltage level higher than the first supply voltage;
   a pull-up driving unit suitable for pull-up driving the output node, to the second supply voltage according to the voltage level of the input signal;
   a bias generation unit suitable for generating a bias voltage fixed to a preset voltage level, wherein the preset voltage level is higher than the first supply voltage and lower than the second supply voltage; and
   a bias operation unit coupled between the output node and the pull-down driving unit, and suitable for lowering a voltage level of the output node in stages based on the bias voltage to supply the lowered voltage to the pull-down driving unit when a pull-down operation is performed by the pull-down driving unit,
   wherein the bias generation unit comprises:
      a first bias generation unit suitable for generating a first bias voltage fixed to a first level that is higher than the first supply voltage and lower than the second supply voltage; and
      a second bias generation unit suitable for generating a second bias voltage fixed to a second level that is higher than the first supply voltage and lower than the first level, wherein the first and second bias voltages are supplied to the bias operation unit.

2. The voltage level shifter of claim 1, wherein the bias operation unit comprises:
   a first bias operation unit suitable for lowering the voltage level of the output node in response to the first bias voltage to supply the lowered voltage to an intermediate node, when the pull-down operation is performed; and
   a second bias operation unit suitable for lowering the level of the intermediate node in response to the second bias voltage to supply the lowered voltage to the pull-down driving unit, when a pull-up operation is performed by the pull-up driving unit,
   wherein the first and second bias operation units are coupled in a cascade manner between the output node and the pull-down driving unit.

3. The voltage level shifter of claim 1, wherein the bias generation unit further comprises an operation control unit suitable for detecting whether the first and second supply voltages are turned ON/OFF based on a preset initial level, and controlling the first and second bias generation units according to a detection result.

4. The voltage level shifter of claim 3, wherein, when the first and second supply voltages become lower than the initial level and are detected as OFF, the bias generation unit does not perform a compulsory control operation on the first and second generation units,
   when the first supply voltage becomes lower than the initial level and is detected as OFF and the second supply voltage becomes higher than the initial level and is detected as ON, the bias generation unit controls the first bias generation unit to fix the first bias voltage to the ground voltage level, and does not perform a compulsory control operation on the second bias generation unit,
   when the first supply voltage becomes higher than the initial level and is detected as ON and the second supply voltage becomes lower than the initial level and is detected as OFF, the bias generation unit does not perform a compulsory control operation on the first bias generation unit, but controls the second bias generation unit to fix the second bias voltage to the second level, and
   when the first and second supply voltages become higher than the initial level and are detected as ON, the bias generation unit controls the first and second bias generation units to fix the first and second bias voltages to the first and second levels, respectively.

5. A voltage level shifter comprising:
   a pull-down driving unit suitable for receiving an input signal swinging between a ground voltage and a first supply voltage, and pull-down driving an output node and a complementary output node to the ground voltage according to a voltage level of the input signal, wherein an output signal outputted through the output node swings between the ground voltage level and a second supply voltage level higher than the first supply voltage;
   a pull-up driving unit suitable for pull-up driving the output node pair, to the second supply voltage based on the voltage level of the input signal;
   a bias generation unit suitable for generating a bias voltage fixed to a preset voltage level, wherein the preset voltage level is higher than the first supply voltage and lower than the second supply voltage; and
   a bias operation unit coupled between the pull-down driving unit and the output node pair, and suitable for lowering voltage levels of the output node pair in stages based on the bias voltage to supply the lowered voltages to the pull-down driving unit when a pull-down operation is performed by the pull-down driving unit,
   wherein the bias generation unit comprises:
      a first bias generation unit suitable for generating a first bias voltage fixed to a first level that is higher than the first supply voltage and lower than the second supply voltage; and a second bias generation unit suitable for generating a second bias voltage fixed to a second level that is higher than the first supply voltage and lower than the first level, wherein the bias operation unit comprises:
a first bias operation unit suitable for lowering the voltage level of the output node pair in response to the first bias voltage to supply the lowered voltage to an intermediate node and a complementary intermediate node, when the pull-down operation is performed; and
a second bias operation unit suitable for lowering the voltage levels of the intermediate node and the complementary intermediate node in response to the second bias voltage to supply the lowered voltage to the pull-down driving unit, when a pull-up operation is performed by the pull-up driving unit,
wherein the first and second bias operation units are coupled in a cascade manner between the output node pair and the pull-down driving unit.

6. The voltage level shifter of claim 5, wherein the first bias operation unit comprises:
a first NMOS transistor having a gate receiving the first bias voltage, a drain coupled to the output node, and a source coupled to the intermediate node; and
a second NMOS transistor having a gate coupled receiving the first bias voltage, a drain coupled to the complementary output node, and a source coupled to the complementary intermediate node.

7. The voltage level shifter of claim 6, wherein the second bias operation unit comprises:
a third NMOS transistor having a gate receiving the second bias voltage, a drain coupled to the intermediate node, and a source coupled to the pull-down driving unit; and
a fourth NMOS transistor having a gate receiving the second bias voltage, a drain coupled to the complementary intermediate node, and a source coupled to the pull-down driving unit.

8. The voltage level shifter of claim 7, further comprising an inverter suitable for inverting the input signal to output the inverted input signal, and operating by using the first supply voltage and the ground voltage.

9. The voltage level shifter of claim 8, wherein the pull-down driving unit comprises:
a fifth NMOS transistor having a gate coupled receiving the inverted input signal, a drain coupled to the drain of the fourth NMOS transistor, and a source receiving the ground voltage; and
a sixth NMOS transistor having a gate receiving the input signal, a drain coupled to the drain of the third NMOS transistor, and a source receiving the ground voltage.

10. The voltage level shifter of claim 9, wherein the first and second NMOS transistors have a gate oxide thickness that is greater than the third to sixth NMOS transistors.

11. The voltage level shifter of claim 9, wherein the pull-up driving unit comprises:
a first PMOS transistor having a gate coupled to the complementary output node, a source receiving the second supply voltage, and a drain coupled to the output node; and
a second PMOS transistor having a gate coupled to the output node, a source receiving the second voltage, and a drain coupled to the complementary output node.

12. The voltage level shifter of claim 5, wherein the bias generation unit further comprises an operation control unit suitable for detecting whether the first and second supply voltages are turned ON/OFF based on a preset initial level, and controlling the first and second bias generation units according to a detection result.

13. The voltage level shifter of claim 12, wherein, when the first and second supply voltages become lower than the initial level and are detected as OFF, the bias generation unit does not perform a compulsory control operation on the first and second generation units,
when the first supply voltage becomes lower than the initial level and is detected as OFF and the second supply voltage becomes higher than the initial level and is detected as ON, the bias generation unit controls the first bias generation unit to fix the first bias voltage to the ground voltage level, and does not perform a compulsory control operation on the second bias generation unit,
when the first supply voltage becomes higher than the initial level and is detected as ON and the second supply voltage becomes lower than the initial level and is detected as OFF, the bias generation unit does not perform a compulsory control operation on the first bias generation unit, but controls the second bias generation unit to fix the second bias voltage to the second level, and
when the first and second supply voltages become higher than the initial level and are detected as ON, the bias generation unit controls the first and second bias generation units to fix the first and second bias voltages to the first and second levels, respectively.

14. An electronic device comprising:
an NTV integrated circuit for reducing power consumption of the electronic device; and
a voltage level shifter,
wherein the voltage level shifter comprising:
a pull-down driving unit suitable for receiving an input signal swinging between a ground voltage and a first supply voltage, and pull-down driving an output node to the ground voltage according to a voltage level of the input signal, wherein an output signal outputted through the output node swings between the ground voltage level and a second supply voltage level higher than the first supply voltage;
a pull-up driving unit suitable for pull-up driving the output node, to the second supply voltage according to the voltage level of the input signal;
a bias generation unit suitable for generating a bias voltage fixed to a preset voltage level, wherein the preset voltage level is higher than the first supply voltage and lower than the second supply voltage; and
a bias operation unit coupled between the output node and the pull-down driving unit, and suitable for lowering a voltage level of the output node in stages based on the bias voltage to supply the lowered voltage to the pull-down driving unit when a pull-down-operation is performed by the pull-down driving unit.

* * * * *